March 5, 1974 A. JACOB 3,795,557

PROCESS AND MATERIAL FOR MANUFACTURING SEMICONDUCTOR DEVICES

Filed May 12, 1972

United States Patent Office 3,795,557

Patented Mar. 5, 1974

3,795,557

PROCESS AND MATERIAL FOR MANUFACTURING SEMICONDUCTOR DEVICES

Adir Jacob, West Roxbury, Mass., assignor to LFE Corporation, Waltham, Mass.

Filed May 12, 1972, Ser. No. 252,863

Int. Cl. C23f *1/02*; H01l *7/50*

U.S. Cl. 156—8 12 Claims

ABSTRACT OF THE DISCLOSURE

A process step and material for use in the manufacture of semiconductor devices. To facilitate the etching of unmasked silicon dioxide, silicon nitride, silicon monoxide, bare silicon layers, or various refractory metals on preselected portions of a semiconductor slice, the material is exposed to a low pressure RF generated "cold" plasma (under 325° C.) produced from a homogeneous gaseous binary mixture of oxygen and a halocarbon. The halocarbon is preferably a gas having one carbon atom per molecule and is preferably fully fluorine-substituted.

FIELD OF THE INVENTION

This invention relates in general to a process and material useful in analytical procedures, and more particularly to a process and material useful in the manufacture of semiconductor devices, enabling the etching of various metals (molybdenum, tungsten, tantalum, etc.) and common passivation or diffusion barrier materials (e.g., SiO, $SiO_2$, $Si_3N_4$) during the processing of such devices.

BACKGROUND OF THE INVENTION

In the conventional technique for the manufacture of semiconductor devices, a slice of semiconductor material (p- or n-type accepts a relatively thin layer, typically 5,000 to 10,000 A., of an insulating film grown or deposited on one or both of its surfaces. A layer of photoresist material is then spun onto the insulating layer of one side, and is subsequently exposed to UV light through a mask having openings corresponding to those areas on the semiconductor slice where it is desired to generate semiconductor junctions. After exposure of the photoresist material through the mask, the mask is removed and the layer of photoresist is developed and processed by means of a suitable solvent, exposing select areas of the underlying insulating layer. A wet acid-based dip is then used to etch the insulating layer from the surface of the semiconductor slice in the exposed areas, the remaining photoresist material serving as an etch-mask for the surface covered by it. Following the wet etching process, a water rinse and a drying step are implemented. The remainder of the photoresist material is subsequently removed, followed by an acid dip required for the removal of inorganic residues. The photoresist material can also be removed by a plasma process utilizing the halocarbon-oxygen gaseous mixtures disclosed by the present inventor in his U.S. patent application, Ser. No. 173,537, filed Aug. 20, 1971. Following a further drying step, diffusion of dopant material into the exposed areas of the semiconductor slice (where there is no insulating layer) is commenced to produce a predetermined junction.

Among the problems and drawbacks associated with the etching step used in this particular technique are:

(1) Physical degradation of a photoresist etch mask.
(2) Finite chemical degradation of a metallic etch mask.
(3) Impairment of line-line resolution due to (1) and/or (2).
(4) Enhanced undercutting effects creating undesirable slopes of the etched channel.
(5) Severe chemical degradation (corrosion) of underlying metalization layers; e.g., aluminum in multileveled structures.
(6) Slow and technically elaborate etching of silicon monoxide and silicon nitride.
(7) Required post-etch water rinse and drying steps invariably reducing production yields.
(8) Short shelf-life of etching solution due to inevitable contamination.
(9) Generally very hazardous to personnel and undesirably polluting.

Accordingly, the general object of the present invention is to provide an improved process and new material that overcome the aforementioned problems and provide uniform etching reactions at a rapid rate.

SUMMARY OF THE INVENTION

In accordance with the present invention, there is provided a gas discharge flow apparatus adapted to form a gaseous plasma within a reaction chamber. It has been discovered that if the generated plasma comprises reactive species resulting from the decomposition and excitation of a gaseous binary mixture of oxygen and a halocarbon that includes flourine as a major substituent, passivation layers or diffusion barriers (e.g., SiO, $SiO_2$, $Si_3N_4$) can be etched in excess of 3000 A./min. without degradation of an organic photoresist etch mask. Polycrystalline and single crystals of silicon, and a variety of metals (e.g., molybdenum, tantalum, tungsten, etc.) can be etched in excess of 2000 A./min. under similar conditions. While the above etch rates are commensurate with the preservation of an organic photoresist etch mask in this chemically hostile environment, appreciably higher etch rates can be achieved with the utilization of metallic etch masks (e.g., aluminum, gold, etc.). Metallic etch masks are normally attacked by aqueous acidic etch solutions currently in use; however, they are chemically inert to the etching plasma disclosed herein.

DESCRIPTION OF PREFERRED EMBODIMENT

Figures 1, 2:
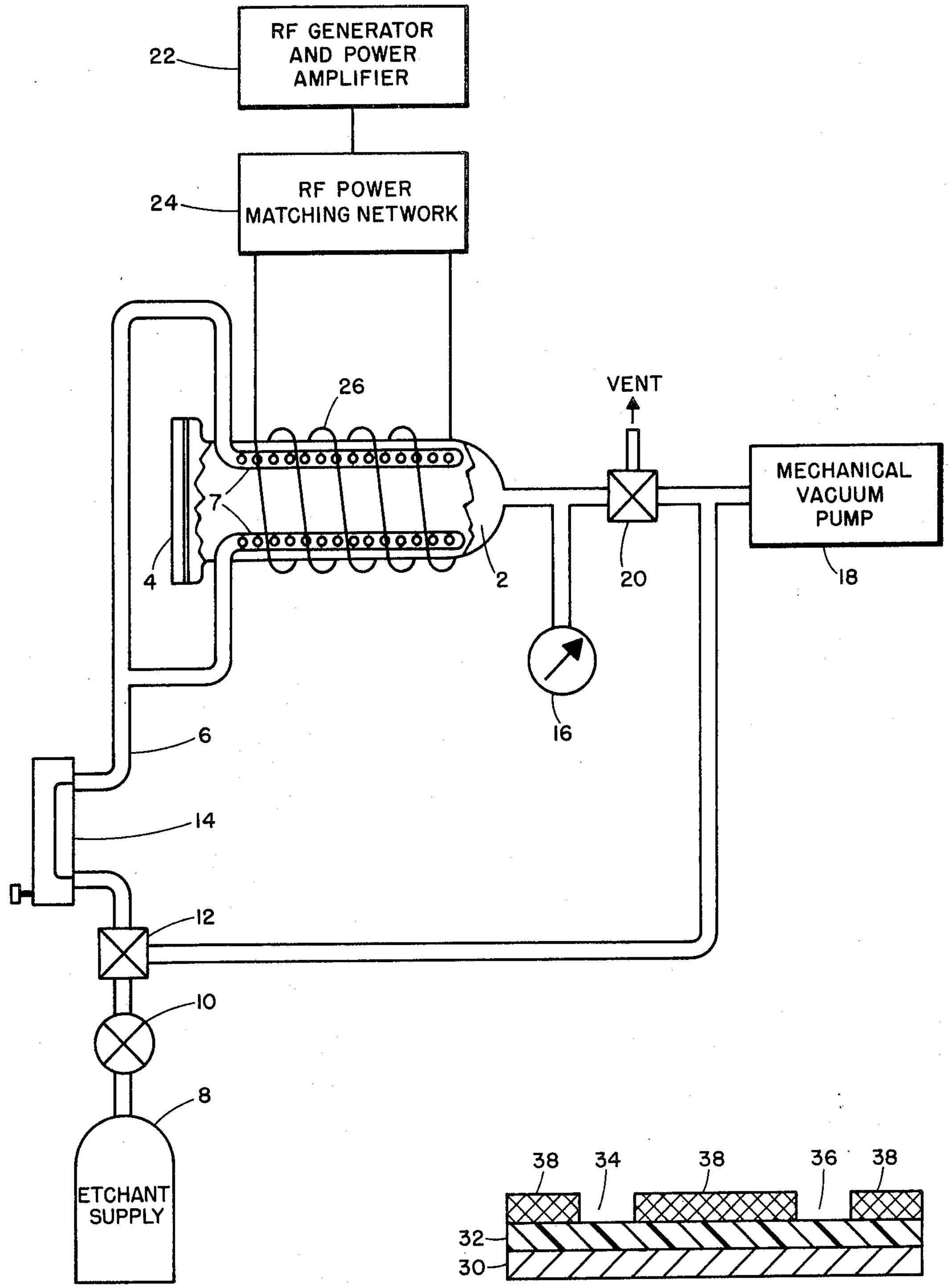
FIG. 1 is an illustration in diagrammatic form of a gas discharge flow system useful in the process of this invention.
FIG. 2 is an illustration in cross-sectional view of a typical semiconductor slice at an intermediate stage of the manufacturing process.

FIG. 1 depicts diagrammatically an apparatus performing the process described in the invention. The apparatus includes a reactor chamber 2, typically made of quartz, having a cover 4 and a gas inlet manifold 6. The side of the reactor 2 has been partially broken away in the drawing so as to better illustrate the gas diffusion tubes 7 which are disposed therein and are externally connected to manifold 6. Such a reactor is disclosed in U.S. Pat. No. 3,619,402, issued on Nov. 9, 1971, and assigned to LFE Corporation.

A pressurized supply 8 of a binary gaseous mixture comprised of oxygen and a halocarbon gas described below is connected through a pressure regulating valve 10, a three-way solenoid valve 12, and a flowmeter 14 to manifold 6. A vacuum gauge 16 provides an indication of total reaction pressure in reactor 2. At any time, and prior to introduction of the gas mixture to manifold 6, the corersponding flow lines are constantly evacuated through the three-way solenoid valve 12 leading to the mechanical vacuum pump 18, this being the case also under conditions where air at atmospheric pressure prevails in reactor 2 through the utilization of the three-way isolation valve 20. A source of radio frequency power 22 provides exciting energy through a matching network 24 to coil 26 which surrounds reaction chamber 2. Preferably, inductor 26 consists of a multiturn coil having two coil sections whose respective coil turns are wound in opposite directions, as disclosed in U.S. patent application, Ser. No. 186,739, filed on Oct. 5, 1971, now Pat. No. 3,705,091, and assigned to LFE Corporation. Although the binary gaseous mixture is preferably premixed and supplied to the reactor from a single container 8, it will be apparent that the oxygen and halocarbon gases may, if desired, be supplied from separate sources via separate flow lines and mixed within either manifold 6 or reactor 2. In operation, the gaseous mixture is admitted to reaction chamber 2 where the inductively coupled radio frequency energy creates a "cold" plasma. Such a reaction system is commercially available from the Process Control Division of LFE Corporation, under the trade designation PDE–301 or PDE–504. Typically, the RF power employed is between 175 and 225 watts contínous radiation at 13.5 mHz.

The general process is one in which as many as 25 semi-conductor wafers at an appropriate stage of the manufacturing process are placed in reactor 2 and exposed to the plasma generated by the admission of an appropriate gaseous mixture of oxygen and a halocarbon gas. For the appropriate reactions to take place, the reaction chamber is evacuated to a residual pressure of 20 to 50 microns mercury prior to the admission of the gaseous etchant. The process provides rapid and uniform etching of dielectrics (up to 5000 A./min.) across a typical production batch of semiconductor slices with negligible loss of an organic etch mask.

In FIG. 2 there is shown in cross-sectional view a portion of a typical semiconductoor device at a suitable processing stage for the utilization of this invention. The semiconductor device consists of a semiconductor material 30, such as silicon (or GaAs, GaAsP, InSb) having a relatively thin (200 to 10,000 A.) layer of a dielectric material 32 (e.g., SiO, $SiO_2$, $Si_3N_4$) either deposited or thermally grown onto it. This dielectric layer 32 (sometimes p or n-type doped) is to be etched at the openings 34 and 36 in the overlying photoresist mask 38. These openings or windows in the etch mask 38 represent fractional areas of less than 1 percent to 80 percent of the total area of the semiconductor slice, and correspond to positions on the semiconductor slice where it is desired to form a semiconductor junction by a subsequent diffusion of suitable dopants.

If the semiconductor device, as depicted in FIG. 2, is exposed to the prescribed plasma formed from a gaseous mixture of oxygen and a halocarbon gas or vapor, the photoresist material will stay intact while the exposed dielectric film 32 will be etched down to the semiconductor layer 30 in openings 34 and 36. It has been found that an effective halocarbon should be selected from the group of organohalides having no more than two carbon atoms per molecule and in which the carbon atoms are attached to a predominance of fluorine atoms. If a liquid halocarbon is considered, it should have a boiling point between 20 and 120° C. associated with a vapor pressure of at least 50 torr at 25° C. The preferred gaseous mixture is produced from a mixture containing 8.5 percent by volume of oxygen and 91.5 percent tetrafluoromethane gas. This optimum combination can be supplied from a prepared pressurized mixture maintained in a commercially available metal cylinder. Careful and close control of this dry etching process will permit the manufacture of semiconductor devices with high line-line resolution (0.15 mil.). It also provides a significant reduction in the undercutting of the etch mask, coupled with the option to control the slope of the etched channel. It further provides an efficient and simultaneous means for etching various dielectrics with an insignificant chemical or physical deterioration of over-exposed underlying substrates such as aluminum, gallium arsenide, indium antimonide, garnets, etc. Satisfactory results were achieved with mixtures of up to 25 percent by volume of oxygen. In general, for the mixture combinations in the aforementioned group, an increase in the number of carbon atoms per molecule tends to slow down the etching process, while an increase in the mole fraction of oxygen (up to 0.5) tends to result in an excessive etch rate of the dielectric layer 32 with associated degradation of the photoresist mask and the line-line resolution. Increasing the mole fraction of the halocarbon beyond 0.5 tends to appreciably reduce the average etch rate.

The successful operation of this process is believed to include competitive homogeneous and heterogenous reactions in the plasma such that atomic oxygen, generated by the decomposition of molecular oxygen, reacts with solid silicon dioxide layers to form a reduced silicon oxide entity, e.g., silicon monoxide. This lower oxide of silicon is further converted by the fluorocarbon-based plasma to either volatile silicon tetrafluoride, $SiF_4$, or to volatile silicon oxyfluoride, $Si_2OF_6$, that is removed with the main gas stream to the vacuum pump. This reaction path, via the lower oxide of silicon, gives rise to thermochemically preferable reaction products as opposed to products that will ensue from the direct attack of either fluorine atoms or fluorinated hydrocarbon radicals on a silicon dioxide solid film. As a result, the presence of molecular oxygen in the etchant mixture enhances the etching (volatilization) of commonly encountered silicon dioxide films, since this reaction is coupled with a correspondingly higher probability of occurrence. By the same token, it is also believed that etching of silicon nitride layers proceeds via a similar lower oxide of silicon. In this case, the overall reaction is more exothermic, leading to a correspondingly enhanced etching of silicon nitride over silicon dioxide—a much desired result currently unobtainable within the semiconductor industry. It is this very feature of the plasma etch process that enables the direct photoresist masking of silicon nitride layers prior to etching, as opposed to indirect masking of such films by silicon dioxide and photoresist films in a multistep procedure currently employed with wet chemical etchants.

It has been found that the mixtures and operating parameters set forth below produce acceptable results in the described process. These parameters are intended to optimize the etch rate of dielectric films at negligible loss or degradation of any commercially available organic photoresist etch masks. Higher gaseous flow rates, RF power levels, etc., will enable correspondingly higher etch rates which may be used in conjunction with inorganic (e.g., metal) etch masks whose degradation is substantially avoided with this etching process.

| Etchant | Etchant flow rate (micromoles sec.$^{-1}$) | Total pressure (microns Hg) | RF power (watts) | Material etched | Percent area etched | No. wafers | Etch rate (A min.$^{-1}$) |
|---|---|---|---|---|---|---|---|
| $CF_4$, 1% $O_2$ | 42.6 | 695 | 200 | Th.[1] $SiO_2$ | 40 | 1 | 390 |
| $CF_4$, 8.5% $O_2$ | 9 | 220 | 150 | Th.[1] $SiO_2$ | 5 | 1 | 620 |
| $CF_4$, 8.5% $O_2$ | 52 | 780 | 200 | Th.[1] $SiO_2$ | 40 | 25 | 300 |
| $CF_4$, 8.5% $O_2$ | 55 | 850 | 250 | Th.[1] $SiO_2$ | 20 | 1 | 1,000 |
| $CF_4$, 8.5% $O_2$ | 22 | 450 | 150 | Dep.[2] $SiO_2$ on Al | 5 | 1 | 2,600 |
| $CF_4$, 8.5% $O_2$ | 45 | 690 | 200 | Molybdenum | 70 | 1 | 1,500 |
| $CF_4$, 8.5% $O_2$ | 15 | 340 | 250 | Dep. $Si_3N_4$ | 5 | 20 | 670 |
| $CF_4$, 8.5% $O_2$ | 55 | 850 | 200 | Tungsten | 70 | 1 | 1,000 |
| $CF_4$, 8.5% $O_2$ | 55 | 850 | 200 | Selenium | 70 | 1 | 1,500 |
| $CF_4$, 8.5% $O_2$ | 15 | 340 | 200 | Dep. $Si_3N_4$ | 5 | 1 | 1,300 |
| $CF_4$, 15.5% $O_2$ | 55 | 770 | 200 | Th. $SiO_2$ | 40 | 1 | 840 |
| $CF_4$, 23.5% $O_2$ | 28 | 465 | 125 | Th. $SiO_2$ | 40 | 1 | 800 |
| $CF_4$, 29% $O_2$ | 100 | 1,343 | 300 | Th. $SiO_2$ | 100 | 1 | 5,100 |
| $CF_4$, 50% $O_2$ | 110 | 1,415 | 150 | Th. $SiO_2$ | 100 | 1 | 1,890 |
| $CF_4$, 69% $O_2$ | 17 | 275 | 300 | Th. $SiO_2$ | 100 | 1 | 1,000 |
| $CHF_3$, 41% $O_2$ | 50 | 1,365 | 300 | Th. $SiO_2$ | 100 | 1 | 2,000 |
| $CHF_3$, 55% $O_2$ | 38 | 1,005 | 125 | Th. $SiO_2$ | 100 | 1 | 1,200 |
| $CHF_3$, 80.5% $O_2$ | 133 | 3,496 | 400 | Th. $SiO_2$ | 100 | 1 | 2,800 |
| $CHF_3$, 93.7% $O_2$ | 115 | 2,996 | 300 | Th. $SiO_2$ | 100 | 1 | 500 |
| $C_2F_6$, 50% $O_2$ | 108 | 1,435 | 300 | Th. $SiO_2$ | 40 | 1 | 500 |
| $CF_2ClCCl_2F$, 75% $O_2$ | 53 | 710 | 300 | Th. $SiO_2$ | 40 | 1 | 1,000 |

[1] Th.=Thermally oxidized. [2] Dep.=Vapor deposited.

What is claimed is:

1. A process for chemically converting material in a plasma environment, comprising the step of:
   exposing the material to a gaseous plasma formed from a binary mixture consisting essentially of oxygen and a halocarbon having no more than two carbon atoms per molecule, wherein at least one carbon atom in said molecule is linked to a predominance of fluorine atoms to produce as an intermediate low order oxides.

2. A process for etching material in a plasma environment comprising the step of:
   exposing the material to a gaseous plasma formed from a binary mixture consisting essentially of oxygen and a halocarbon having only one carbon atom per molecule, said carbon atom being linked to a predominance of fluorine atoms to produce as an intermediate a low order oxide.

3. A process as in claim 2 wherein the reaction temperature is within the range of 25 to 300 degrees centigrade.

4. A process as in claim 2 wherein said halocarbon gas includes at least one hydrogen atom.

5. A process as in claim 2 wherein said halocarbon and said oxygen are supplied to a reactor from separate sources.

6. A process as in claim 2 wherein said halocarbon and said oxygen are supplied to a reactor from a common premixed source.

7. A process as in claim 6 wherein said gaseous binary mixture contains 8.5 percent oxygen and 91.5 percent tetrafluoromethane by volume,
   said mixture being supplied to said reactor at a total flow rate within the range of 9 to 55 micromoles per second corresponding total pressures of 220 to 850 microns mercury, and having RF energy coupled to said mixture within the range of 20 to 400 watts.

8. A composition of matter, useful for chemically converting material in a plasma environment, consisting essentially of a binary gaseous mixture of oxygen and a halocarbon having no more than two carbon atoms per molecule, wherein at least one carbon atom in said molecule is linked to a predominance of fluorine atoms.

9. A composition of matter, useful in a process for etching material in the presence of an organic etch mask by forming fluorine-based and oxyfluoride-based compounds volatile in a low pressure-low temperature plasma, consisting essentially of a binary gaseous mixture of oxygen and tetrafluoromethane wherein said mixture contains 1 to 25 percent oxygen by volume.

10. A composition of matter, useful in a process for etching material in the absence of an organic etch mask by forming fluorine-based and oxyfluoride-based compounds volatile in a low pressure-low temperature plasma, consisting essentially of a binary gaseous mixture of oxygen and tetrafluoromethane wherein said mixture contains 1 to 75 percent oxygen by volume.

11. A composition of matter, useful in a process for etching material in the presence of a metal etch mask by forming fluorine-based and oxyfluoride-based compounds volatile in a low pressure-low temperature plasma, consisting essentially of a binary gaseous mixture of oxygen and tetrafluoromethane wherein said mixture contains 1 to 75 percent oxygen by volume.

12. A composition of matter, useful in a process for manufacturing semiconductors, comprising a binary gaseous mixture of oxygen and tetrafluoromethane, said oxygen constituting 8.5 percent of the mixture by volume.

References Cited

UNITED STATES PATENTS 3,615,956 10/1971 Irving et al. ........... 156—17

WILLIAM A. POWELL, Primary Examiner

U.S. Cl. X.R.

156—17; 252—79.1

UNITED STATES PATENT OFFICE
CERTIFICATE OF CORRECTION

Patent No. 3,795,557 Dated March 5, 1974

Inventor(s) Adir Jacob

It is certified that error appears in the above-identified patent and that said Letters Patent are hereby corrected as shown below:

PATENT OFFICE ERRORS

Column 1, line 37 reading:

"rial (p- or n-type accepts a relatively thin layer, typically"

Should read:

--rial (p or n-type)accepts a relatively thin layer, typically--

Column 2, line 53 reading:

"In the drawings:"

Should read:

--In the drawing:--

Column 3, line 15 reading:

"6, the corersponding flow lines are constantly evacuated"

Should read:

--6, the corresponding flow lines are constantly evacuated--

Column 3, line 54 reading:

"portion of a typical semiconductoor device at a suitable"

Should read:

--portion of a typical semiconductor device at a suitable--

U.S. GOVERNMENT PRINTING OFFICE

UNITED STATES PATENT OFFICE
CERTIFICATE OF CORRECTION

Patent No. 3,795,557 Dated March 5, 1974

PAGE - 2

Inventor(s) Adir Jacob

It is certified that error appears in the above-identified patent and that said Letters Patent are hereby corrected as shown below:

APPLICANT'S ERROR

Column 3, line 6 reading:

"No. 3,619,402, issued on Nov. 9, 1971, and assigned to"

Should read:

--No. 3,619,403 issued on Nov. 9, 1971, and assigned to--

Signed and sealed this 10th day of September 1974.

(SEAL)
Attest:

McCOY M. GIBSON, JR.
Attesting Officer

C. MARSHALL DANN
Commissioner of Patents